(12) United States Patent
Tanaka et al.

(10) Patent No.: US 6,521,007 B1
(45) Date of Patent: Feb. 18, 2003

(54) CLEAN BOX

(75) Inventors: Akira Tanaka; Kazuo Ohkubo; Yoko Suzuki; Hideaki Sekiguchi, all of Toyko (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/555,798

(22) PCT Filed: Dec. 2, 1998

(86) PCT No.: PCT/JP98/05426
§ 371 (c)(1),
(2), (4) Date: Jul. 24, 2000

(87) PCT Pub. No.: WO99/28213
PCT Pub. Date: Jun. 10, 1999

(30) Foreign Application Priority Data

Dec. 3, 1997 (JP) ............................................. 9-348584

(51) Int. Cl.[7] .......................... B65D 85/00; B65D 85/38; H01L 21/68
(52) U.S. Cl. ....................... 55/385.2; 55/285.1; 55/418; 55/471; 206/710; 206/711
(58) Field of Search ............................. 55/385.1, 385.2, 55/385.6, 418, 471; 206/710, 711; 454/187, 192

(56) References Cited

U.S. PATENT DOCUMENTS

| | | | | |
|---|---|---|---|---|
| 4,471,716 A | * | 9/1984 | Milliren ...................... | 118/500 |
| 4,770,680 A | | 9/1988 | Machida et al. | |
| 5,207,548 A | * | 5/1993 | Suffer ......................... | 414/404 |
| 5,255,797 A | * | 10/1993 | Kos ........................... | 206/334 |
| 5,346,518 A | * | 9/1994 | Bateman et al. .......... | 55/385.6 |
| 5,749,469 A | * | 5/1998 | Williams .................... | 206/454 |

FOREIGN PATENT DOCUMENTS

| | | |
|---|---|---|
| JP | 55-134238 | 10/1980 |
| JP | 62-269334 | 11/1987 |
| JP | 63-32950 | 2/1988 |
| JP | 63-028046 | 2/1988 |
| JP | 1-207944 | 8/1989 |
| JP | 2-096348 | 4/1990 |
| JP | 2-107384 | 4/1990 |
| JP | 4-051544 | 2/1992 |
| JP | 4-225547 | 8/1992 |
| JP | 6-318631 | 11/1994 |
| JP | 7-283092 | 10/1995 |
| JP | 8-148551 | 6/1996 |

* cited by examiner

Primary Examiner—Duane Smith
Assistant Examiner—Minh-Chau T. Pham

(57) ABSTRACT

A cleanbox that can prevent contamination from not only external sources but also from within the cleanbox from such sources as substrates and internal components of the cleanbox, includes a casing container (18) formed by a container main body (12) and a lid member (14) for hermetically sealing a top opening section of the container main body; a dividing wall (20) for forming circulation paths having an upstreaming path and a downstreaming paths within the casing container; a substrate holding section (24) disposed in the upstreaming path for holding broad surfaces of substrates (W) approximately parallel to the upstreaming path; an air filter (26) and a gas removal filter (28) disposed upstream in relation to the substrate holding section in the upstreaming path; and a motor-driven fan (30) housed in the casing container for producing air streams circulating in the circulating paths.

58 Claims, 11 Drawing Sheets

F I G. 8
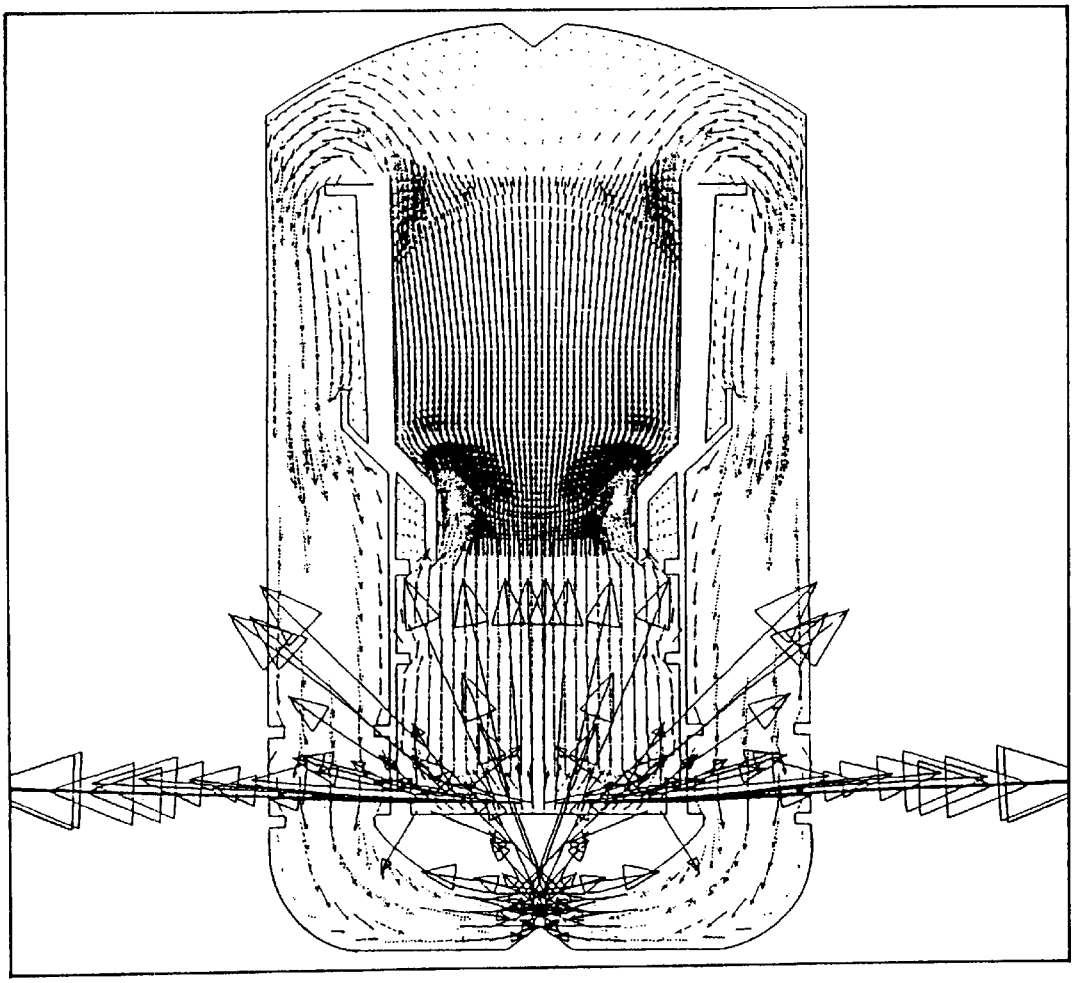

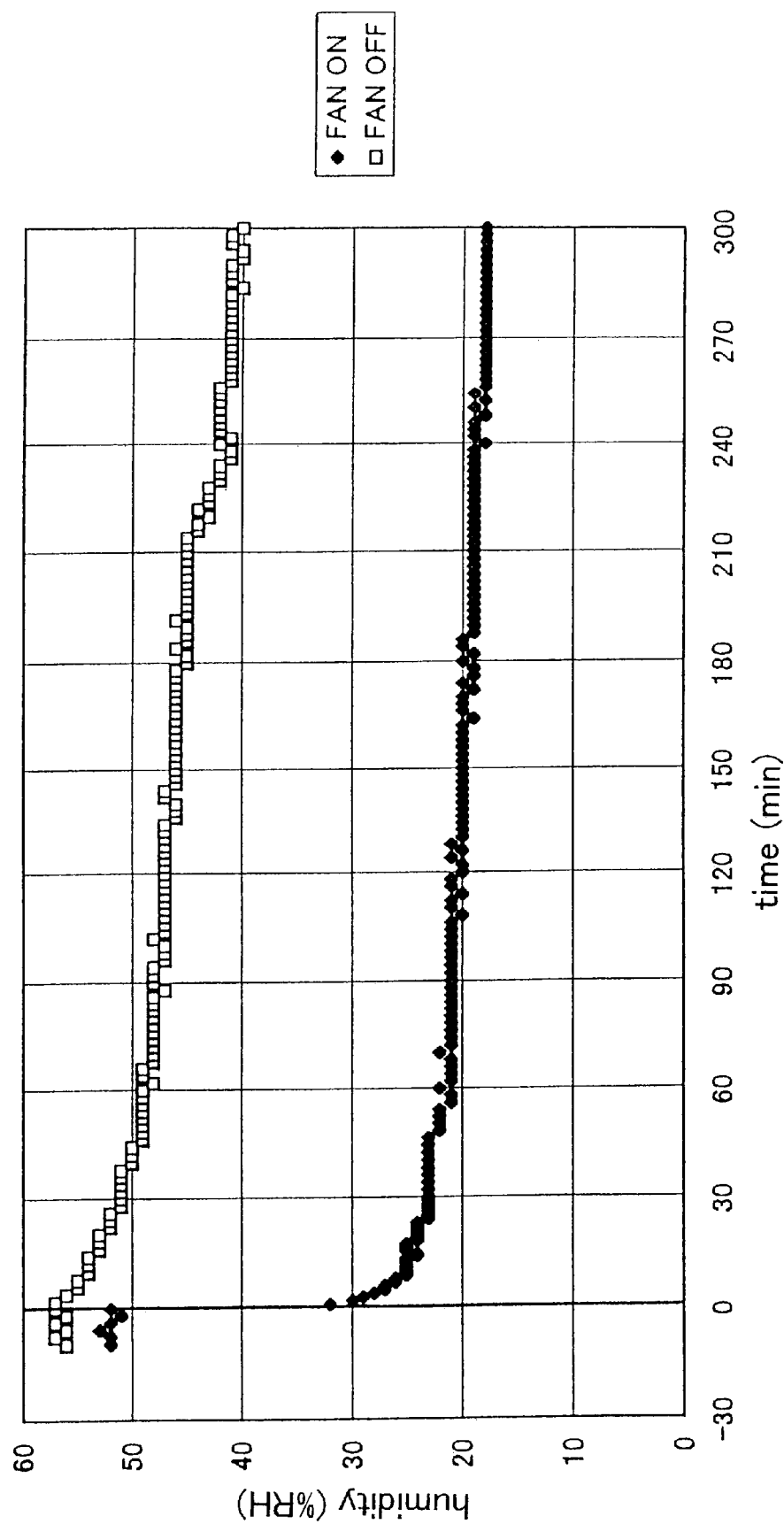

CLEAN BOX

TECHNICAL FIELD

This invention relates to a cleanbox suitable for use in storing or transporting objects to be processed such as semiconductor wafers, photomasks and hard discs in an ultra-clean environment.

BACKGROUND ART

When transporting/storing substrates to be processed such as semiconductor wafers and photomasks used in production plants for semiconductor devices, minute amount of dust particles adhering to the objects such as semiconductor wafers and gaseous impurities existing in the atmosphere surrounding the objects lead to lower product yield. Such contamination problems become more critical as the density of circuit integration increases. For magnetic discs also, the advent of magnetic reluctance head has resulted in significantly accelerating high density recording so that product cleanliness is being demanded in terms of not only dust particles but gaseous impurities. From the viewpoint of reducing reaction of substrates, convenient means for maintaining low humidity are also important during storage of substrates.

The demand for such a clean environment in which to transport/store substrates has led to the development of cleanboxes equipped with high-efficiency particle air (HEPA) filter and ultra-low penetration air (ULPA) filter working in conjunction with a circulation fan. Also, other types of storage devices include replacing the air surrounding the wafers in the cleanbox with high purity nitrogen so as to maintain non-reacting environment and prevent the growth of native oxide film on the wafer surface.

However, although those cleanboxes based on HEPA and ULPA filters are able to remove particulate contaminants, they are not capable of removing minute amount of organic or inorganic gases. Furthermore, the efficiency of sweeping the environment is reduced and the effects of clean air in preventing contamination cannot be expect, when the circulation system allows a large volume of circulated air to flow into those regions that do not contribute to cleanliness of the environment, or if stagnation occurs within the cleanbox. As for the cleanboxes using a nitrogen-based atmosphere, such boxes are not able to remove impurities emanating from the wafers having some type of coating such as photoresist film, for example, and it also raises a concern related to the safety of nitrogen atmosphere to workers.

DISCLOSURE OF INVENTION

In view of the problems existing in the current technologies, the object of this invention is to provide a cleanbox to prevent not only contamination that can be introduced from external environment but also contamination that can be produced internally from the objects stored in the cleanbox and component parts of the cleanbox.

The invention relates to a cleanbox comprising: a casing container comprised of a container main body and a lid member for hermetically sealing a top opening section of the container main body; a dividing wall for forming circulation paths having an upstreaming path and a downstreaming paths within the casing container; a substrate holding section disposed in the upstreaming path for holding broad surfaces of substrates approximately parallel to the upstreaming path; an air filter and a gas removal filter disposed upstream in relation to the substrate holding section in the upstreaming path; and a motor-driven fan housed in the casing container for producing air streams circulating in the circulating paths.

Accordingly, circulation paths are created within the container, and the flowing streams are purified first by using air filter and a gas removal filter to remove contaminants physically and chemically and then the air streams are directed to the substrate holding section, so that, even if there are particulate and gaseous sources of contaminants adhering to the inner walls of the container or to the wafers themselves, contamination of the wafers stored in the substrate holding section can be prevented. Because the air filter and the gas removal filter in the upstreaming path are placed upstream in relation to the substrate holding section, objects to be cleaned can be readily loaded or unloaded from the top section of the container without the fear of causing contamination to the objects. Also, because the container is quite susceptible to contamination when the lid is opened or closed, the container lid is placed downstream in relation to the substrate holding section, so that any contaminants that may have been brought into the container can be removed long before they can reach the objects.

The filtering membrane of the gas removal filter may be comprised singly of ion exchange fibers or activated charcoal fibers, or by combining these fibers or by activated charcoal particulate embedded in a urethane foam carrier, or by using integrated filtering unit made by weaving these fibers together. The filtering system efficiently removes and adsorbs ions such as ammonia present in the air and ionic substances contained in a mist such as hydrofluoric acid and hydrochloric acid by using ion exchange fibers and activated charcoal fibers produced by activation reaction of carbons produced from cellulose, acrylic and lignin group fibers. Ion exchange fibers may be produced by radiation-induced graft polymerization.

According to another feature of the invention, the upstreaming path is formed approximately centrally in the casing container, and merges with the downstreaming paths formed between the dividing walls and the container main body, by being redirected at a top section and/or a bottom section having an arc surface or a spherical surface. By shaping the top section and/or bottom section into a dome shape having an arc radius or spherical radius, the overall flow is made smooth with no stagnating points, and therefore, the energy required to form circulating paths is reduced so that one battery is sufficient to operate the cleanbox for a prolonged period of time. It is preferable that the radius of curvature be not less than 1.2R when the object wafer radius is R.

According to yet another feature, the lid section at the inner surface and the container main body at the bottom surface are provided with guiding protrusions for separating the streaming path. Normally, the profile of such a protrusion is triangular.

According to yet another feature, the circulation paths are provided with a reverse flow preventing filter in a downstream location to the substrate holding section so as to prevent back streaming of contaminants from the motor-driven fan. Accordingly, even if the fan is stopped, there is no danger of contaminating the wafers due to contaminants in the fan unit.

It is preferable that the motor for the motor-driven fan is a dc brushless motor, because there are no moving parts to generate contaminants. Furthermore, the motor may be canned in a stainless steel casing of 0.2 mm thickness, so that the motor is dustless and gas tight, thereby preventing contamination by gaseous substances emitted from the coils and other parts of the fan.

According to yet another feature, the substrate holding section is a carrier receiving section for freely detachably seating a carrier having openings at the top and the bottom sections, at least, for holding a plurality of substrates. This arrangement enables the wafers to be transported in carrier-based quantities.

According to yet another feature, the substrate holding section is provided with guide grooves for directly supporting the plurality of substrates. Thus, the objects are stored without using the carrier so that the cleanbox can be made more compact and light weight.

According to yet another feature, the substrate holding section houses a plurality of substrates, and the substrate holding section is provided with a diffuser plate for dispersing circulating air in the spaces between the substrates. Accordingly, cleaning of the wafers can be carried out efficiently by producing uniform flow of air in the spaces between the wafers.

According to yet another feature, a cleanbox recited in claim 1, in which the motor-driven fan is operated by a control section. Accordingly, sequences for different mode of operation may be programmed into a microchip, so that intermittent operation may be carried out, or the fan speed may be varied to prolong the service life of the battery to improve the efficiency and economy of operating the cleanbox.

According to yet another feature, the container main body is structurally integrated with constituting component parts in the container main body without using fasteners. Accordingly, contamination generated from the fasteners and other means of joining are prevented while preserving the ease of handling the components of the cleanbox for maintenance and replacement.

According to yet another feature, the container main body is maintained at a low humidity by using a dehumidifying agent made in a sheet form or stored in a bag. Accordingly, low humidity levels in the cleanbox can be achieved quickly by circulating the air inside the cleanbox by means of the fan.

According to yet another feature, the gas removal filter has a filtering membrane made of a non-woven ion exchange fabric or a woven ion exchange fabric produced by radiation-induced graft polymerization.

According to yet another feature, the gas removal filter has a filtering membrane comprising activated charcoal produced by imbedding activated charcoal particulate in activated charcoal fibers or urethane foam.

According to yet another feature, the gas removal filter has a filtering membrane comprising a combination of a gas removal filter having a filtering membrane made of a non-woven ion exchange fabric or a woven ion exchange fabric produced by radiation-induced graft polymerization and a filtering membrane comprising an activated charcoal produced by imbedding activated charcoal particulate in activated charcoal fibers or urethane foam.

BRIEF DESCRIPTION OF DRAWINGS

FIG. 8 is a front view of flow patterns obtained by computer analysis in the third embodiment;

FIG. 13 is a graph showing changes in the humidity in the fourth embodiment.

BEST MODE FOR CARRYING OUT THE INVENTION

Preferred embodiments of this invention will be presented in the following with reference to the drawings.

Figure 1:
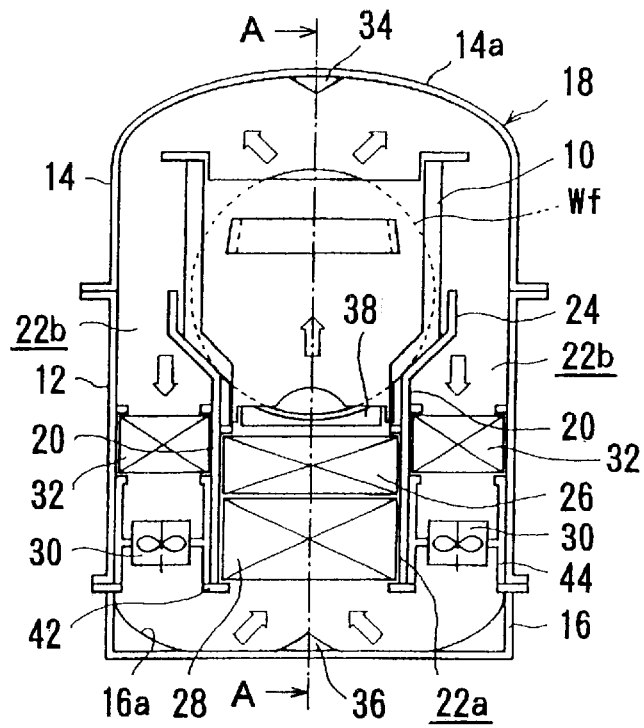
FIG. 1 is a cross sectional front view of a cleanbox in a first embodiment of this invention.
Figure 2:
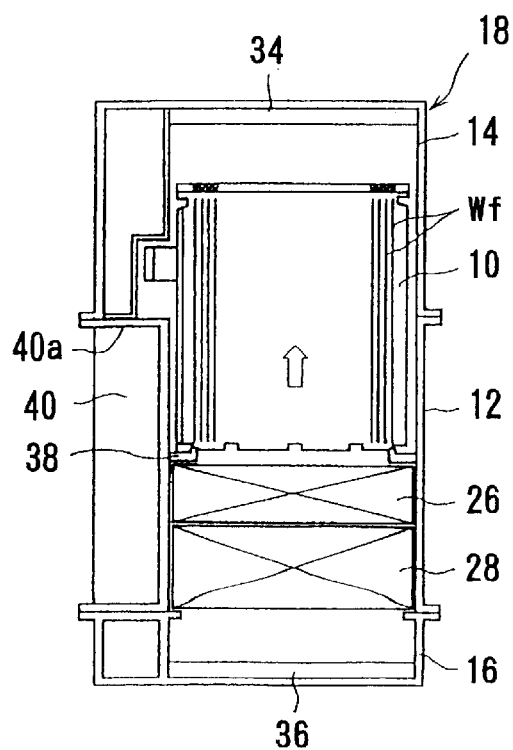
FIG. 2 is a cross sectional view through a plane A—A in FIG. 1.
Figure 3:
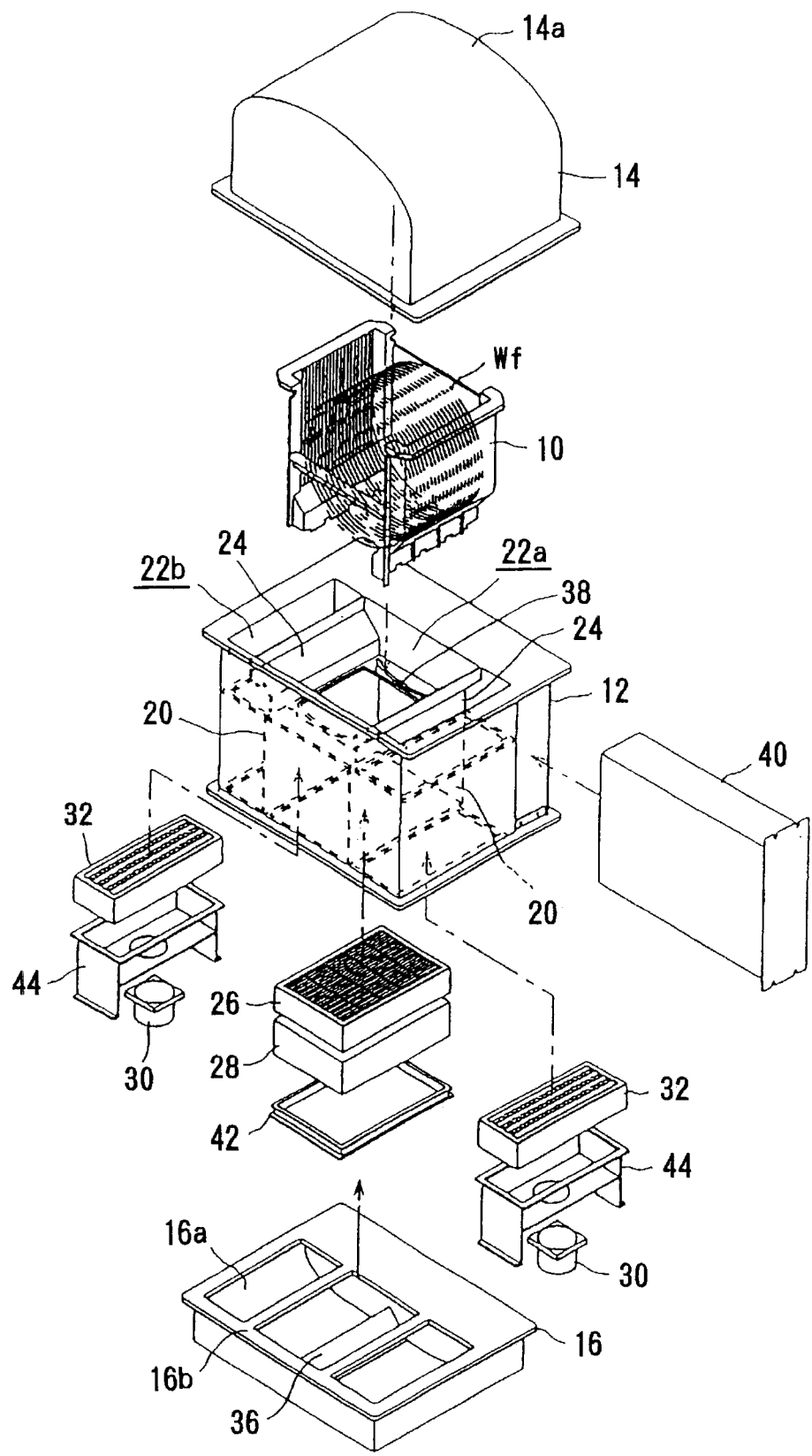
FIG. 3 is a perspective view of the components of the cleanbox shown in FIG. 1.

FIGS. 1–3 show a first embodiment of the cleanbox used for holding, storing and transporting a plurality of semiconductor wafers (substrates for further processing) Wf in a carrier 10. The cleanbox is comprised by a container main body 12 of a square cylindrical shape; a lid member 14 for covering the freely openable lid section at the top end of the container main section; and a bottom section 16 covering the open section at the bottom end; and hermetically sealing these components together to form a hermetically sealed casing container 18. There is no need to make the casing container 18 (including the main section 12; lid section 14 and the bottom section 16) from expensive materials that are known to produce low gas emission, e.g., engineering plastics or fluoride resins, which include polycarbonate, polytetrafluoroethylene, polybutylene terephthalate and polyether etherketone, for example. The structures used in this invention can be made from relatively low cost materials that are easily fabricated or formed such as polypropylene, acrylonitrile butadiene styrene resins and their alloys. Antistatic agents may be included 1in the raw materials.

The interior of the casing container 18 is divided into a central chamber 22a and a pair of side chambers 22b on both lateral ends of the central chamber 22a by means of a pair of left and right dividing walls 20 leaving spaces at the top and bottom ends for the lid section 14 and the bottom section 16. A substrate holding section (carrier support section) 24 having an upwardly expanding taper section is integrally provided above the dividing walls 20 in such a way to couple with the tapered bottom section of the carrier section 10.

An air filter 26 for removing primarily particulate matters and a gas removal filter 28 for removing gaseous impurities are freely detachably disposed below the substrate holding section 24 of the central chamber 22a so as to permit free flow of air in the vertical direction. In each of the lateral chambers 22b, a dc motor-driven brushless fan 30 is provided so as to direct the air downwards, and a reverse flow prevention gas removal filter 32 is disposed immediately above the fan 30.

The ceiling section 14a of the lid section 14 is shaped to form a smoothly curving inside surface, and an upper laminar plate 34 of a triangular profile shape is provided in the center region. Similarly, the inner bottom section 16a of the bottom section 16 is shaped to form a smoothly curving surface, and a bottom laminar plate 36 of a triangular profile shape is provided in its center region. A carrier entry laminar plate 38 is also provided below the substrate holding section 24.

Using a commonly available wafer carrier 10 of a 25-wafer storing capacity, the spacing between the 1st wafer and the container main body and the spacing between the 25th wafer and the container main body are made wider than the spacings between the wafers Wf so as not to supply the same volume of air for all the wafers. By providing a carrier entry laminar plate 38, air flow rates through the spaces between the container main body and the 1st and 25th wafers are adjusted to be equalized in such a way that the air is supplied for all these wafers effectively.

A power feeding slot 40a is provided on the lateral surface of the container main body for freely detachably holding an electrical power unit 40 having a terminal for connecting the power terminal to the motor-driven fan 30. The power unit 40 has an internal control device to operate the fan 30 according to control programs to start/stop the operation and to control the rotational speed of the fan 30.

As shown in FIG. 3, the component elements inside the cleanbox are assembled by coupling the components successively, without using fasteners such as rivets, except for the dividing plates which are integrally attached to the container main body. The filters 26, 28 disposed in the central chamber 22a are successively stacked on the upper frame 16b of the bottom section 16, so as to be retained 20 inside the central chamber 22a. In the lateral chambers 22b, a motor support 44 detachably attaches the motor-driven fan 30 above the upper frame 16b, and the gas removal filter 32 is placed on top of the motor support 44, thereby eliminating fasteners that are potential sources of dust particles as well as facilitating disassembly of the container 18 for washing and cleaning.

In this embodiment, gas removal filter 28 is made of a woven mixture of ion exchange fibers and activated charcoal fibers, but such a part may also be made by wrapping a non-woven ion exchange fabric around a urethane form serving as the carrier for embedding particles of activated charcoal. Activated charcoal fibers may be produced by subjecting carbon fibers made from rayon, kainol, polyacrylonitrile, kerosene, and tar pitch and reacting the fibrous carbon with steam and carbon dioxide gas and the like at a temperature in excess of 800° C. to carry out the so-called gasification activation process. Some activated charcoal fibers contain binders, that do not contribute to adsorption, for the purpose of strengthening and dust prevention, but it is preferable that the fibers do not contain such binders from the viewpoint of their performance.

Activated charcoal contains numerous fine pores in fundamental carbon crystals because unincorporated carbons are removed in the process of activation. The fine pores together with the large surface area are the contributing factors for the physical adsorption action exhibited by the activated charcoal. Some activated charcoal filters are available commercially, and these use the property of strong adsorption action by imbedding activated charcoal particulate. Other commercially available filters for filtering air are based on activated charcoal fibers whose pores are finer than the those in the particulate types, and are readily formable and produce less dust and offer a higher specific surface area. Other commercially available types include open pore structure fibers made of urethane fibers, which are imbedding activated charcoal particulate of approximately 0.5 mm diameter.

On the other hand, ion exchange fibers may be produced by introducing ion exchange radicals into polymeric fibers by radiation-induced graft polymerization reaction. Such fibers are high molecular weight polymers including polyethylene, polypropylene, and natural polymeric fibers such as cotton, wool fibers or fabrics, which are subjected to radiation from electron beam and gamma radiation and the like to generate activation sites. These activated sites are radical sites, which are highly reactive, however, the properties of the base fiber can be altered by chemically combining a monomer to the radical sites to produce a filter material having different properties than the base fibers.

This technology is called graft polymerization because the monomers are grafted to the base material. By radiation-induced graft polymerization process, it is possible to produce non-woven ion exchange material having much improved ion exchange rates than ion exchange beads which are generally called ion exchange resins. Polyethylene non-woven fabric may be treated by this technique by attaching ion exchange species such as sulfone, carboxyl, and amino group monomers represented by sodium styrene sulfonic acid, acrylic acid or aryl amines.

Similarly, monomers that can accept ion exchange radicals such as styrene, chlormethyl styrene, glycidylmethacrylate, acrylonitrile, or acrolein as the base may be radiation grafted and ion exchange radicals introduced afterwards to produce a filter that retains the original shape.

In this embodiment, gas removal filter 28 was produced by weaving ion exchange fibers and activated charcoal fibers concurrently, but ion exchange fibers and activated charcoal fibers may be used singly or in combination to produce a gas removal filter.

Next, air filter 26 will be explained. The HEPA filter has a particle capture efficiency in excess of 99.97% for particle of 0.3 $\mu$m size at the standard flow rate. In the 1980s, however, with the advent of high density circuit integration in LSI circuits, it has become necessary to develop filters capable of handling class 10 (10 particles/ft$^3$) environment, and filters of higher performance than the HEPA filters. In response to such a demand, ULPA filters are now available commercially.

At the beginning, glass fibers were used for ULPA filters, but a problem was discovered that glass fibers produce $BF_3$ by reacting with hydrogen fluoride (HF) gas used in semiconductor processing. Recently, ULPA filters using polytetrafluoroethylene (PTFE) as the filtering fibers that do not contain boron and metallic impurities and do not react with acid, alkaline and organic solvents have become commercially available. In this invention, glass fibers or PTFE fibers are used as appropriate.

Next, dehumidifying agents will be explained. There are several commercial brands available, some of the representative substances are listed below. Physical adsorbers available include: silica gel, molecular sieve, synthetic zeolite, and chemical adsorbers include calcium chloride, magnesium chloride. Any of these dehumidifying agents may be used in the cleanbox, but it is preferable to use physical adsorbers that give off lesser amount of contaminants in the form of dust and organic or inorganic vapors.

The operation of the cleanbox of such a construction will be explained. The interior space of the box is maintained cleanly, and filters 26, 28, 32 and the (electrical power unit are installed in their respective places. The lid section 14 is removed in a highly clean environment such as a cleanroom so that the carrier 10 with wafers Wf can be placed on the substrate holding section 24, and the lid section 14 is reinstalled tightly. The carrier 10 can be placed easily inside because the substrate holding section (carrier support section) 24 is situated above the filters 26, 28.

The external switch is turned on, then the motor-driven fan 30 starts operating according to some pre-installed program. Accordingly, circulation paths are formed inside the container, descending along the lateral chambers 22b, and ascending the central chamber 22a, after which the central stream is split in the upper region into two lateral streams so as to descend along each of the lateral chambers 22b and return separately to the fan 30. More specifically, the air stream directed downward by the dc brushless motor-driven fan 30 flows along the floor 16b of the bottom section 16, and is redirected by the lower laminar plate 36 so that each stream flows upward and the air streams merge together to form an ascending air stream through the central region.

The air is cleaned by flowing through both gas removal filter 28 and the ULPA filter 26, and is guided between the wafers Wf by the carrier entry laminar plate 38. By providing the carrier entry laminar plate 38, excessive flow of air between the wafers is prevented. The air streams that passed through the spaces between the wafers Wf are directed along the upper laminar plate 34 and the inner surface 14a of the lid section 14 to reverse the direction, and flow along the lateral chambers 22b to pass through the filter 32 to be cleaned and returned to the fan 30.

In the process of air circulation inside the casing container, solid particles that may be adhering to various sections and gaseous substances emitted from various materials are swept by the circulated air, and are cleaned in the two filters 26, 28 disposed in the upstream location, and the air streams are then allowed to flow between the wafers Wf. Therefore, the casing container not only prevents contamination from external sources, but it aids in cleaning any substances that may be present in the interior space, thus preventing so-called self-contamination. Also, because the wafers are in the upstreaming location and upstream side of the lid section 14 and the lid section 14 is susceptible to contamination from external air, contamination of the wafers caused by external sources can be prevented.

Operational mode for the fan 30 may be chosen from a variety of program modes depending on the usage of the cleanbox. Generally, at the beginning of the operation, the motor may be operated continuously or at a high flow rate so as to provide active cleaning of the air brought into the casing container. After cleaning the air in this mode, the flow rate may be lowered or the fan, may operated intermittently to prevent contamination of the wafers from the contaminants that may be generated from the wafers Wf themselves or components present in the casing container. This mode of operation prolongs battery life.

Here, even if contaminants are generated from the motor when the fan 30 is stopped, they are prevented from reaching the wafers Wf because of the presence of reverse flow prevention filter 32.

Figure 4:
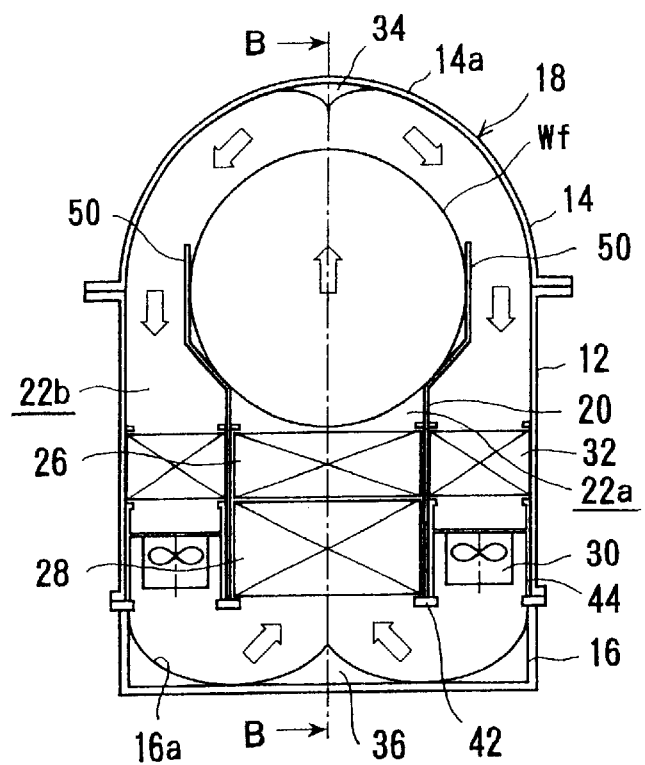
FIG. 4 is a cross sectional front view of a cleanbox in a second embodiment of this invention.
Figure 5:
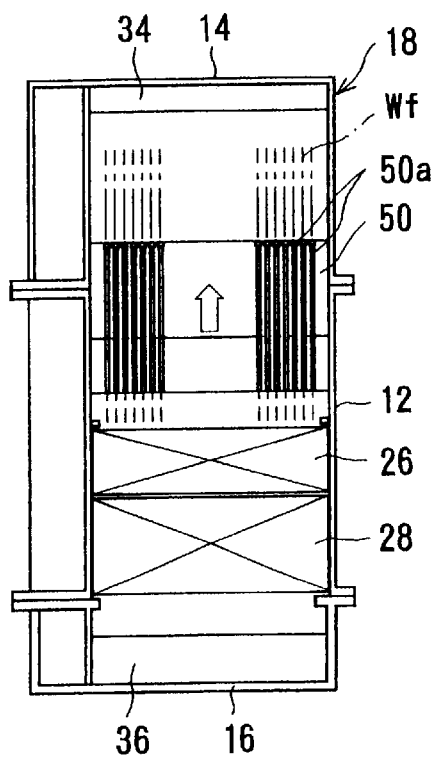
FIG. 5 is a cross sectional view through a plane B—B in FIG. 4.

FIGS. 4 and 5 show a second embodiment of this invention. The difference between this embodiment and the first embodiment is that the shape of the ceiling section 14a of the lid section 14 is made approximately arc shaped, whose radius of curvature is greater than the radius of curvature of the wafers. For example, if the wafer radius R, the lid curvature is higher than 1.2R so that the air stream flowing along the ceiling section 14a will be re-directed smoothly. Also, in this embodiment, the carrier 10 serving as the object holder is made integral with the object holding plate 50 so that a carrier is not needed. Opposing guide grooves 50a are provided in the object holding plate 50 to support the wafers Wf at their peripheries.

Figure 6:
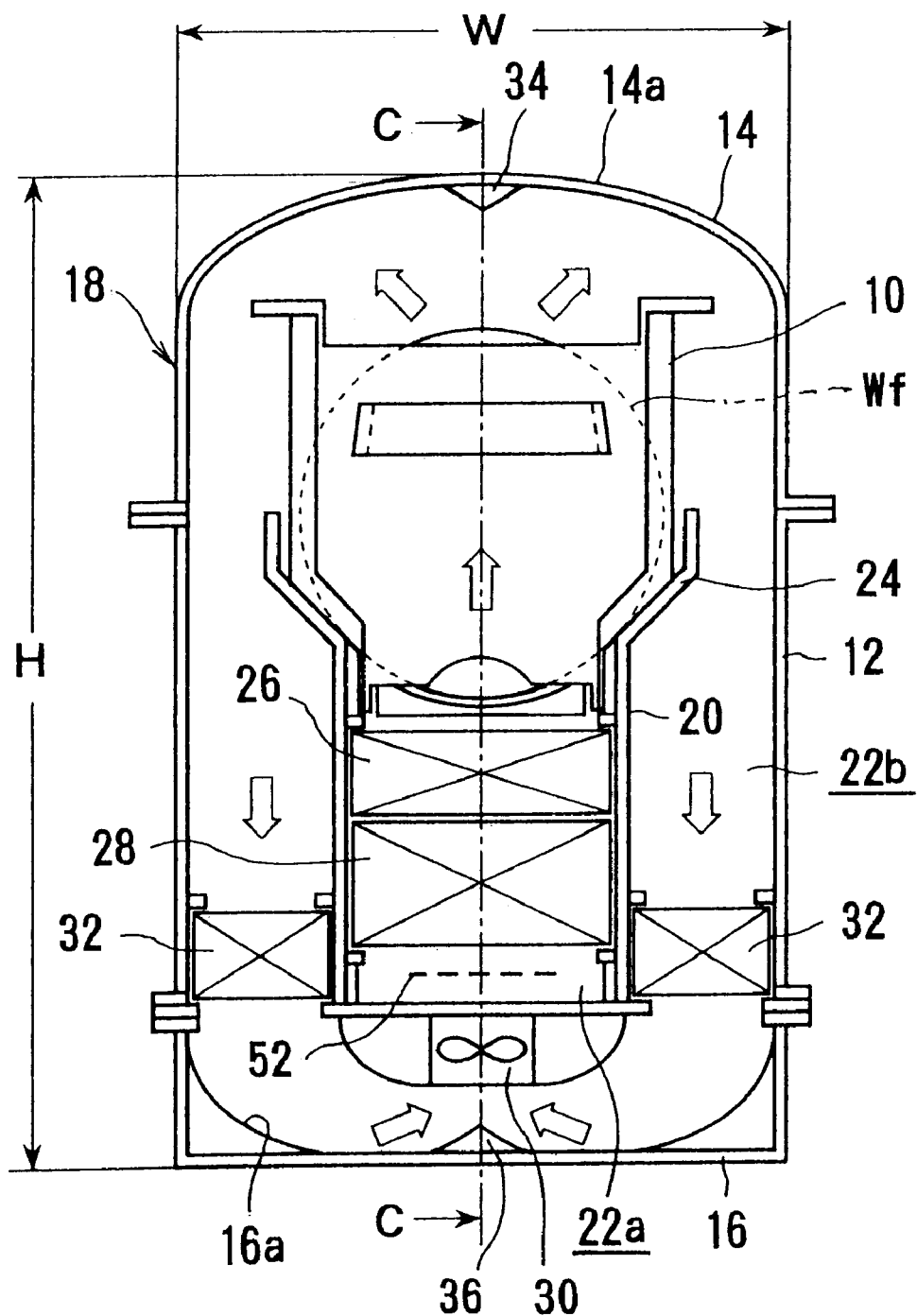
FIG. 6 is a cross sectional front view of a cleanbox in a third embodiment of this invention.
Figure 7:
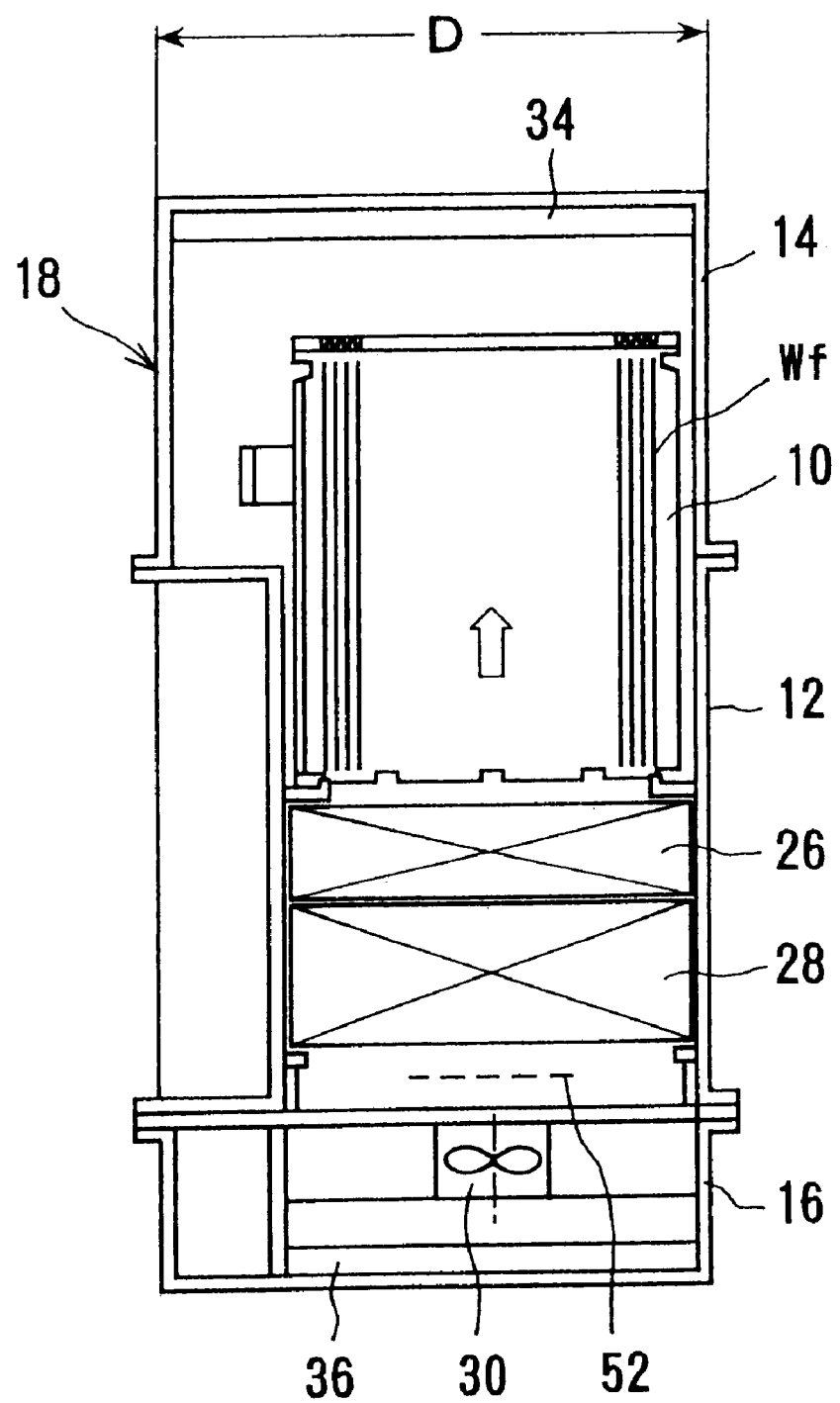
FIG. 7 is a cross sectional view through a plane C—C in FIG. 6.

FIGS. 6 and 7 show a third embodiment of this invention. The difference between this embodiment and the first embodiment is that the motor-driven fan 30 is disposed on the bottom section 16, below the central chamber 22a, so as to direct the air upwards. Specifically, the bottom section is provided with a support for the fan 30, and a diffuser plate 52 is disposed between the fan 30 and the gas removal filter 28 so as to disperse the air uniformly through the entire width of the central chamber 22a.

This design permits to use only one motor-driven fan to lighten the weight of the cleanbox. Specifically, the dimensions of the casing container 18 are 250 mm width, 200 mm depth and 380 mm height to give a total weight of 6 Kg, including twenty-five 6-inch wafers so that the casing container can be carried by a person. The cleanbox is designed so that the air circulating at 0.1 m$^3$/min inside the casing container 18 will produce an air speed of 0.1 m/s when flowing through the center region between the wafers Wf.

Figure 9:
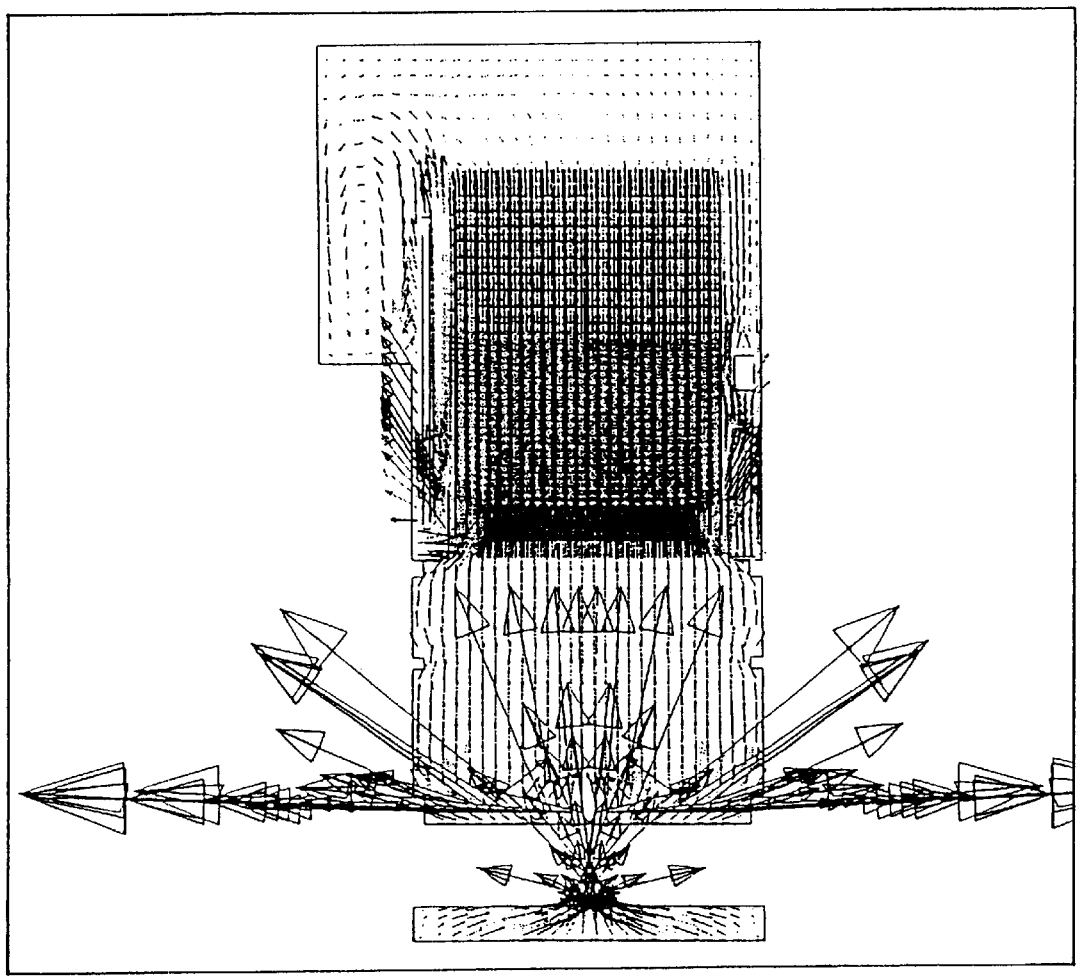
FIG. 9 is a side view of the flow patterns obtained by computer analysis in the third embodiment.

FIGS. 8 and 9 show the results of computer analysis of the flow patterns in the casing container of the third embodiment as seen in a front view and a side view, respectively. The flow patterns relate to the distribution of air speed at the exit of the fan 30 and the flow lines inside the container main body. The se flow diagrams demonstrate that the air filtered through the gas removal filter 28 made of weaving the ion exchange fibers and activated charcoal fibers together and the ULPA filter 26 flows between the wafers Wf uniformly without generating any stagnation inside the casing container 18.

Figure 10:
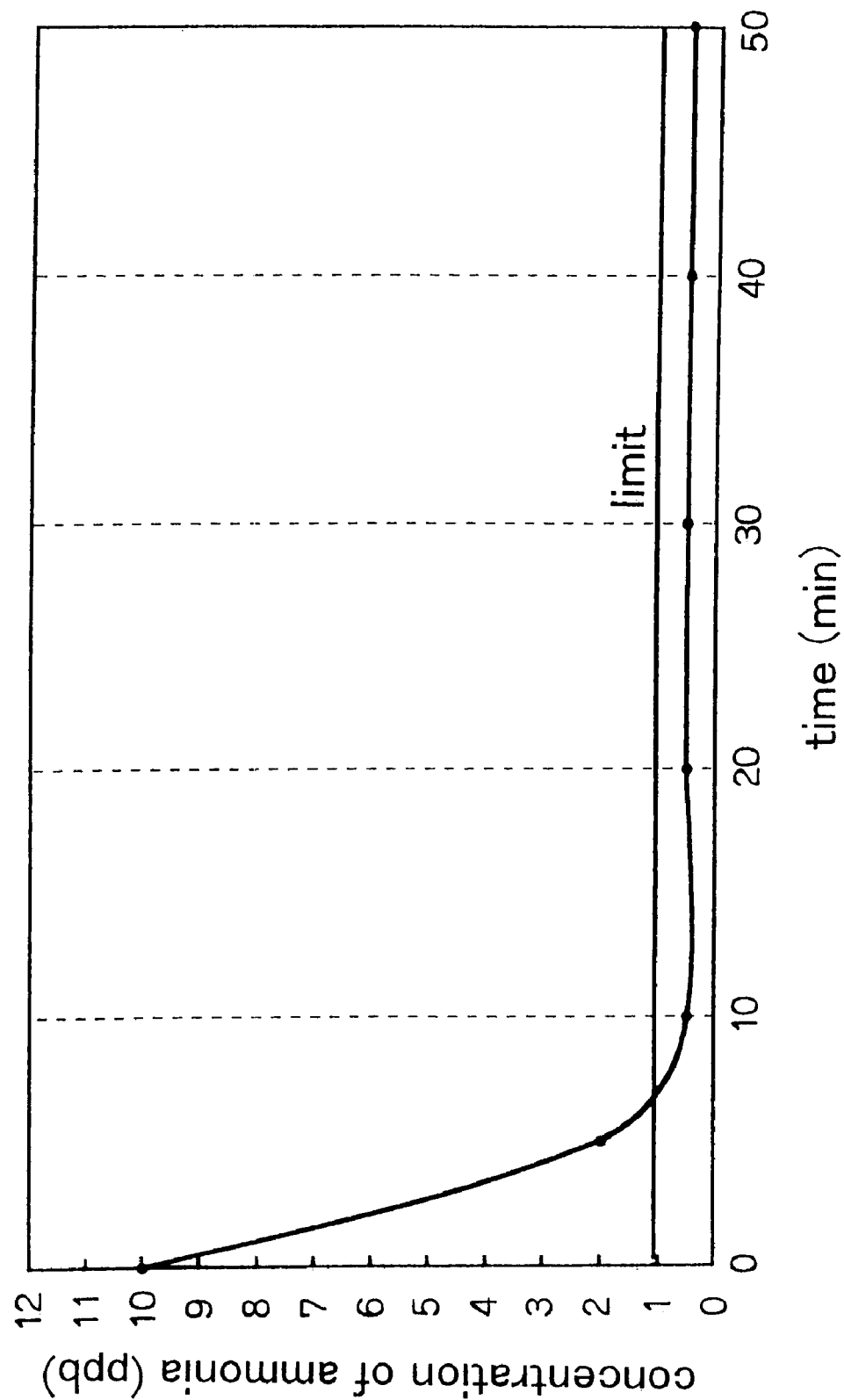
FIG. 10 is a graph showing changes in the concentration of gaseous ammonia in the third embodiment.

Next, FIG. 10 shows changes that occur during the cleaning process for a given initial concentration of ammonia. The method used was the impinger method. It can be seen in the diagram that even when the ambient concentration is low, the concentration is lowered to 1 ppb within 10 minutes of operation.

Figure 11:
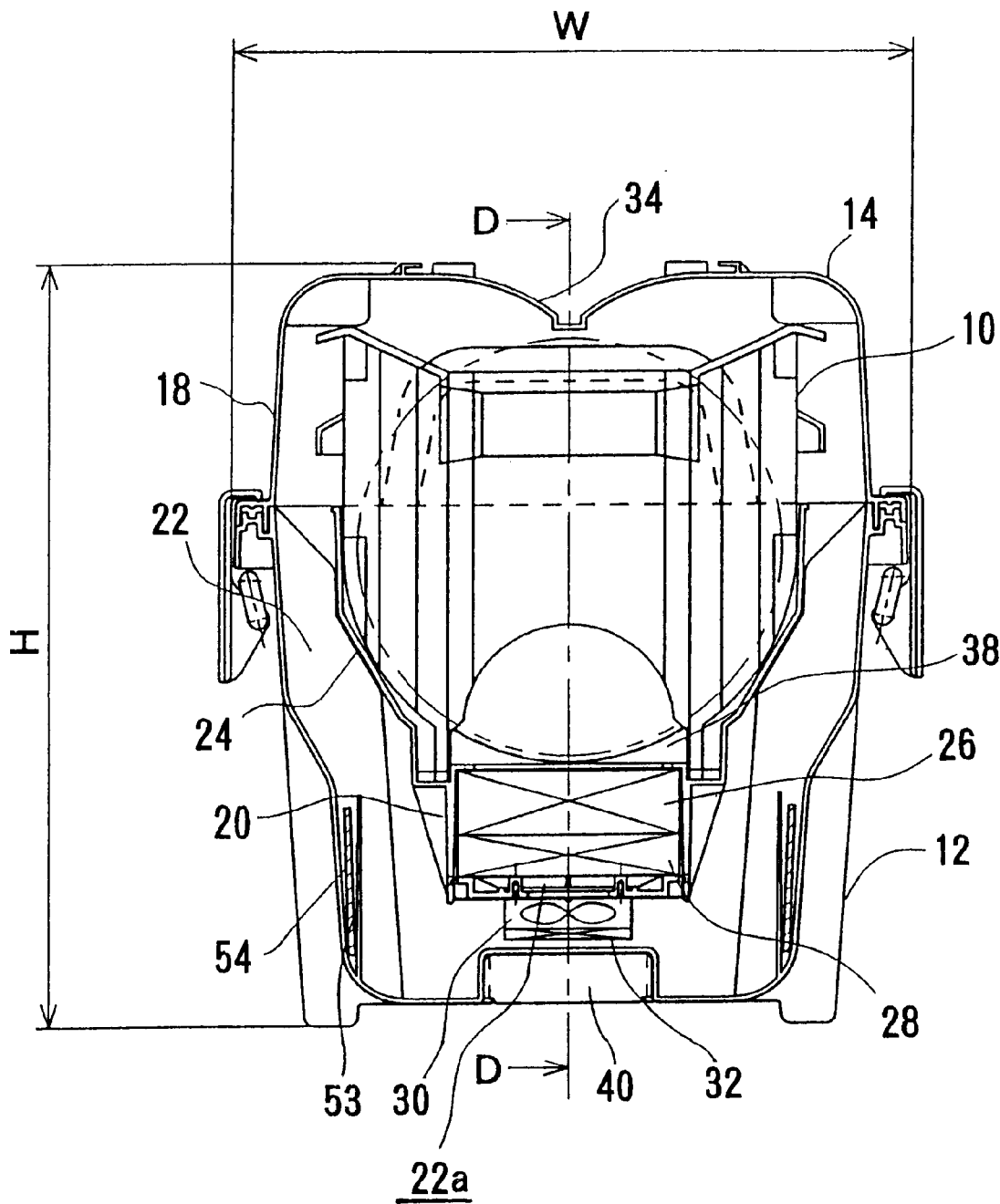
FIG. 11 is a cross sectional front view of a cleanbox in a fourth embodiment of this invention.
Figure 12:
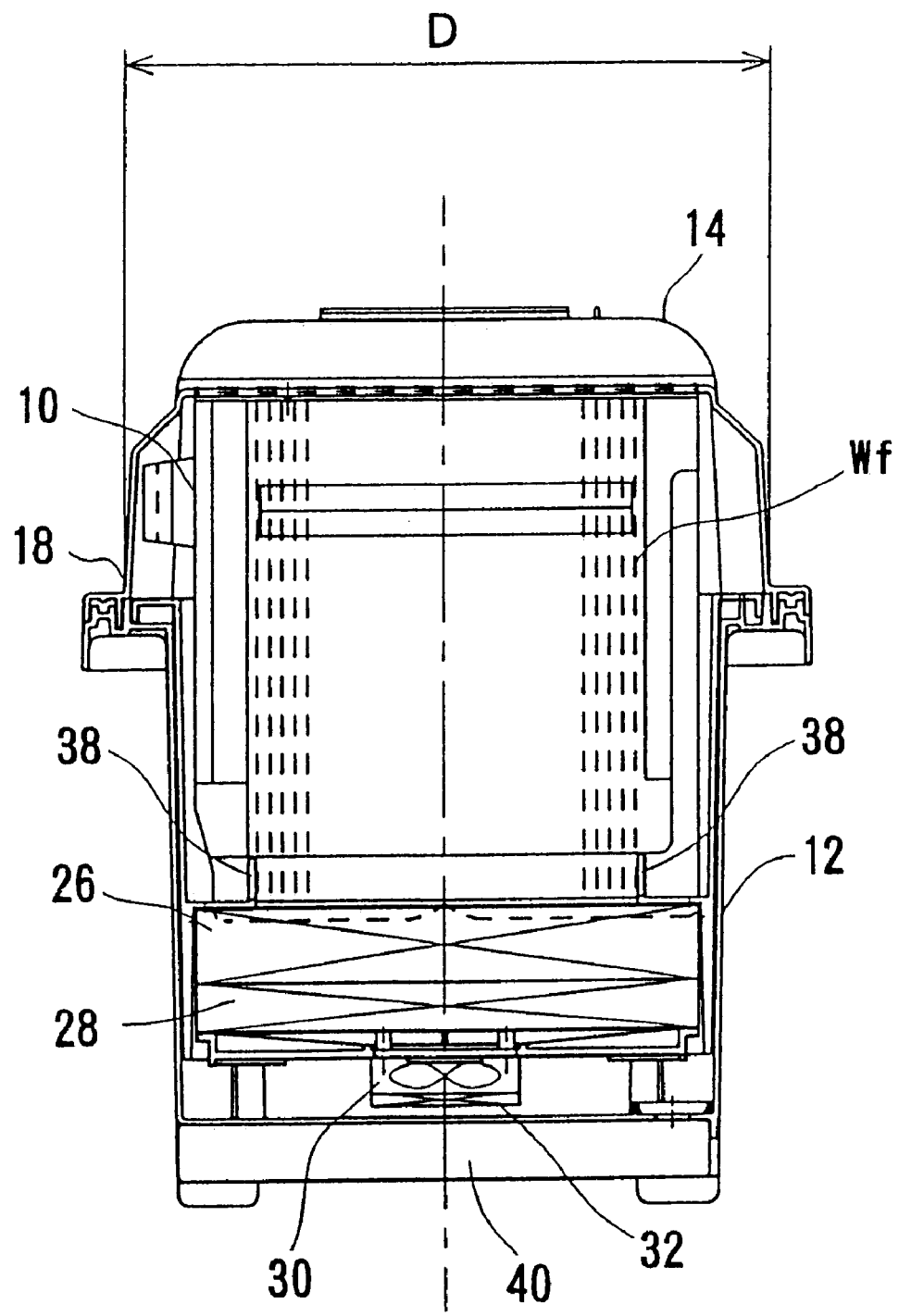
FIG. 12 is a cross sectional view through a plane D—D in FIG. 11.

FIGS. 11 and 12 show a fourth embodiment of this invention. The differences between this embodiment and the third embodiment are that the power unit 40 is disposed on the bottom section 16, the gas removal filter 32 for prevention of reverse flow is disposed at the entrance to the fan 30, a pocket 53 for storing the dehumidifying agent is provided, and the casing container 18 is designed to be made by injection molding to permit mass production of the cleanbox.

Such a design provides a low center of gravity in a compact and light weight structure. The dimensions of the casing container 18 are 280 mm width, 220 mm depth and 360 mm height to give a total weight of 6 Kg, including twenty-five 8-inch wafers so that the casing container is lighter weight than the weight of casing container in the third embodiment, even though the diameter of wafer has been increased.

Next, the results of measuring changes in the humidity by providing 100 g of dehumidifying agent inside the fourth embodiment of the cleanbox will be presented in FIG. 13. The results relate to a comparison of two cases, when the fan 30 was operated continuously and when the fan 30 was stopped. The results in FIG. 13 demonstrate that it is possible to lower the relative humidity to about 25% by operating the fan 30 for several minutes.

As explained above, this invention provides a cleanbox that prevents not only external contaminants from entering the environment but also prevents contaminants emitted from the substrates themselves, because the air directed to the wafers is first cleaned by passing the air streams through the air filter and gas removal filter, to perform physical and gas removal filtering, before the air streams are allowed to come into contact with the wafers. The cleanbox thus contributes significantly to improving the production yield and performance qualities of those objects that must avoid contaminants caused by particulate and gaseous substance at all cost, such as semiconductor wafers and photomasks. Because the air filter and the gas removal filters are disposed upstream in relation to the wafer holding section, loading/unloading the wafers can be carried out from the top section of the casing container, and because the container lid is disposed downstream in relation to the wafer holding section, it is possible to avoid contamination caused by the wafer holder which is susceptible to contamination while the lid is open. Further, by including the humidifying agent inside the box and circulating air in the box, the humidity inside the box can be lowered in a short time to a relative humidify value that is less than 25% to contribute to reducing the chemical reaction of the wafers with an ambient atmosphere.

Industrial Applicability

This invention is useful for cleanbox used to store or transport objects such as semiconductor wafers and photomasks, for example, until they are needed for processing in cleanrooms.

What is claimed is:

1. A cleanbox comprising:
   a casing container comprised by a container main body and a lid member for covering an opening of the container main body;
   a pair of dividing walls disposed in said container main body, an air filter and a gas removal filter disposed between said dividing walls;
   a substrate holding section having a pair of object holding plates for holding peripheral portions of substrates therebetween;
   an air flow path defined between said dividing walls and between said object holding plates; and
   a motor-driven fan housed in the casing container for producing air streams circulating between said dividing walls, and between said object holding plates and an outside thereof.

2. A cleanbox according to claim 1, wherein said pair of object holding plates comprises a pair of side-walls of a wafer carrier, which wafer carrier accommodates a plurality of substrates approximately parallel to the air flow path.

3. A cleanbox according to claim 2, wherein said wafer carrier is placed on a carrier support section, which is integrally formed with said pair of dividing walls.

4. A cleanbox according to claim 1, wherein said pair of object holding plates is integrally formed with said pair of dividing walls.

5. A cleanbox according to claim 1, wherein said air flow path is defined at at least one of a top section and a bottom section of-said casing container by a spherical arc surface.

6. A cleanbox according to claims 5, wherein an inner surface of said lid member and a bottom surface of said container main body are provided with guiding protrusions for separating the air flow path.

7. A cleanbox according to claim 1, wherein said air streams are provided with a reverse flow preventing filter in a downstream location to the substrates so as to prevent back streaming of contaminants from the motor-driven fan.

8. A cleanbox according to claim 1, wherein each of said object holding plates is provided with guide grooves for holding a plurality of substrates.

9. A cleanbox according to claim 1, wherein said substrate holding section houses a plurality of substrates, and said substrate holding section is provided with a diffuser plate for dispersing circulating air in spaces between the substrates.

10. A cleanbox according to claim 1, including a control section for said motor-driven fan.

11. A cleanbox according to claim 1, wherein said container main body is structurally integrated with constituting component parts in the container main body without using fasteners.

12. A cleanbox according to claim 1, including a dehumidifying agent in said container main body.

13. A cleanbox according to claim 12, wherein said dehumidifying agent is one of a sheet and an agent stored in a bag.

14. A cleanbox according to claim 1, wherein said gas removal filter has a filtering membrane made of one of a non-woven ion exchange fabric and a woven ion exchange fabric.

15. A cleanbox according to claim 1, wherein said gas removal filter has a filtering membrane comprising one of activated charcoal and activated charcoal fibers.

16. A cleanbox according to claim 1, wherein said gas removal filter has a filtering membrane comprising a combination of a gas removal filter having a filtering membrane made of a non-woven ion exchange fabric or a woven ion exchange fabric, and a filtering membrane comprising an activated charcoal or activated charcoal fibers.

17. A cleanbox according to claim 1, including a power unit outside of said casing container for supplying power to said motor-driven fan.

18. A cleanbox according to claim 17, wherein said power unit is detachably mounted on said casing container.

19. A cleanbox according to claim 17, including a terminal for connecting said power unit provided on a lateral surface of said casing container.

20. A cleanbox according to claim 1, including a control section provided for operating said motor-driven fan.

21. A cleanbox according to claim 1, including a control section provided for operating said motor-driven fan for one of intermittent and variable speed operation.

22. A cleanbox according to claim 20, wherein said control section includes a microchip.

23. A cleanbox according to claim 21, wherein said control section includes a microchip.

24. A cleanbox according to claim 20, wherein said control section operates said motor-driven fan continuously or at a high flow rate at a beginning of operation, and intermittently or at a low flow rate thereafter.

25. A cleanbox according to claim 1, wherein a motor of said motor-driven fan comprises a dc brushless motor.

26. A cleanbox according to claim 1, wherein a motor of said motor-driven fan is hermetically sealed in a casing.

27. A cleanbox comprising:
   a casing container comprised by a container main body and a lid member for covering an opening of the container main body;
   a substrate holding section having a pair of object holding plates for holding peripheral portions of substrates therebetween;
   a first air flow path defined between inner surfaces of said object holding plates;

a second air flow path defined between an outer surface of said object holding plates and an inner surface of said casing container;

a motor-driven fan housed in the casing container for producing air streams circulating through said first air flow path and said second air flow path; and an air filter and a gas removal filter disposed in said circulating air streams.

28. An apparatus for transporting substrates comprising:

a casing container comprised by a container main body and a lid member for covering an opening of the container main body;

dividing walls disposed in a said container main body, an air filter and a gas removal filter disposed between said dividing walls;

a substrate holding section disposed in said casing container having a pair of object holding plates for holding peripheral portions of substrates therebetween;

an air flow path defined between said dividing walls and said object holding plates; and a motor-driven fan housed in the casing container for producing air streams circulating between said dividing walls and said object holding plates.

29. An apparatus according to claim 28, wherein said pair of object holding plates comprises a pair of side-walls of the wafer carrier.

30. An apparatus according to claim 29, wherein said wafer carrier is placed on a carrier support section, which is integrally formed with said pair of dividing walls.

31. An apparatus according to claim 28, wherein said pair of object holding plates is integrally formed with said pair of dividing walls.

32. An apparatus according to claim 28, wherein said air flow path is defined at least one of a top section and a bottom section of said casing container by a spherical arc surface.

33. An apparatus according to claim 32, wherein an inner surface of said lid member or a bottom surface of said container main body is provided with guiding protrusions for separating the air flow path.

34. An apparatus according to claim 28, wherein said air streams are provided with a reverse flow preventing filter in a downstream location to the substrates so as to prevent back streaming of contaminants from the motor-driven fan.

35. An apparatus according to claim 28, wherein each of said object holding plates is provided with guide grooves for holding a plurality of substrates.

36. An apparatus according to claim 28, wherein said substrate holding section houses a plurality of substrates, and said substrate holding section is provided with a diffuser plate for dispersing circulating air in spaces between the substrates.

37. An apparatus according to claim 28, including a control section for said motor-driven fan.

38. An apparatus according to claim 28, wherein said container main body is structurally integrated with constituting component parts in the container main body without using fastners.

39. An apparatus according to claim 28, further including a dehumidifying agent in said container main body.

40. An apparatus according to claim 39, wherein said dehumidifying agent is one of a sheet and an agent stored in a bag.

41. An apparatus according to claim 28, wherein said gas removal filter has a filtering membrane made of one of a non-woven ion exchange fabric and a woven ion exchange fabric.

42. An apparatus according to claim 28, wherein said gas removal filter has a filter membrane comprising one of activated charcoal and activated charcoal fibers.

43. An apparatus according to claim 28, wherein said gas removal filter has a filtering membrane comprising a combination of a gas removal filter having a filtering membrane made of a non-woven ion exchange fabric or a woven ion exchange fabric, and having a filtering membrane comprising an activated charcoal or activated charcoal fibers.

44. An apparatus according to claim 28, including a power unit outside of said casing container for supplying power to said motor-driven fan.

45. An apparatus according to claim 44, wherein said power unit is detachably mounted on said casing container.

46. An apparatus according to claim 44, including a terminal for connecting said power unit provided on a lateral surface of said casing containing.

47. An apparatus according to claim 28, including a control section provided for operating said motor-driven fan.

48. An apparatus according to claim 28, including a control section provided for operating said motor-driven fan for one of intermittent and variable speed operation.

49. An apparatus according to claim 47, wherein said control section includes a microchip.

50. An apparatus according to claim 48, wherein said control section includes a microchip.

51. An apparatus according to claim 47, wherein said control section operates said motor-driven fan continuously or at a high flow rate at a beginning or operation, and intermittently or at a low flow rate thereafter.

52. An apparatus according to claim 28, wherein a motor of said motor-driven fan comprises a dc brushless motor.

53. An apparatus according to claim 28, wherein a motor of said motor-driven fan is hermetically sealed in a casing.

54. A cleaning box comprising:

a casing container conprised by a container main body and a lid member for covering an opening of the container main body;

a pair of dividing walls disposed in said container main body, an air filter and a gas removal filter disposed between said dividing therebetween;

an air flow path defined between said dividing walls and between said object holding plates; and a circulating device housed in the casing container for producing air streams circulating between said dividing walls and said object holding plates.

55. A clean box for transporting substrates comprising:

a casing container comprised by a container main body and a lid member for covering an opening of the container main body;

a pair of dividing walls disposed in said container main body;

a substrate holding section having a pair of object holding plates for holding peripheral portions of the substrates therebetween in the casing container;

an air flow path defined between said dividing walls and said object holding plates;

a filter disposed outside of said dividing walls and said object holding plate and inside wall of said container main body; and a circulation in the casing container for producing air streams through between said dividing walls and said object holding plates, and said filter.

56. An apparatus according to claim 55, wherein said circulation device is disposed outside of said dividing wall and/or said object holding plate and inside of said container main body.

57. A clean box for carrying substrate comprising:
- a casing container comprised by a container main body and a lid member for covering an opening of the container main body;
- a substrate holding section having a pair of object holding plates for holding peripheral portions of the substrates therebetween in the casing container;
- first air flow path defined between said object holding plates;
- second air flow path defined between said object holding plate and inside wall of said container main body;
- a filter disposed between said object holding plate and inside wall of said container main body; and
- a circulation device in the casing container for producing air streams though said first air flow path, said second air flow path and said filter.

58. An apparatus according to claim 57, wherein said circulation device is disposed outside of said object holding plate and inside of said container main body.

* * * * *

UNITED STATES PATENT AND TRADEMARK OFFICE
CERTIFICATE OF CORRECTION

PATENT NO.    : 6,521,007 B1                                        Page 1 of 1
DATED         : February 18, 2003
INVENTOR(S)   : Kazuo Ohkubo et al.

It is certified that error appears in the above-identified patent and that said Letters Patent is hereby corrected as shown below:

Column 9,
Line 61, change "section of-said casing" to -- section of said casing --.

Column 11,
Line 58, change "using fastners" to -- using fasteners --.

Column 12,
Line 40, change "dividing therebetween." to -- dividing walls. --.
Between lines 40 and 41, insert -- a substrate holding section having a pair of object holding plates for holding peripheral portions of substrates therebetween; --.
Line 57, change "dividing walls and said" to -- dividing wall and/or said --.
Line 60, change "a circulation in the" to -- a circulation device in the --.

Signed and Sealed this

Twenty-first Day of October, 2003

JAMES E. ROGAN
*Director of the United States Patent and Trademark Office*